(12) United States Patent
Iyengar et al.

(10) Patent No.: US 11,158,566 B2
(45) Date of Patent: Oct. 26, 2021

(54) INTEGRATED CIRCUIT WITH A RING-SHAPED HOT SPOT AREA AND MULTIDIRECTIONAL COOLING

(71) Applicant: Google LLC, Mountain View, CA (US)

(72) Inventors: Madhusudan Krishnan Iyengar, Foster City, CA (US); Norman Paul Jouppi, Palo Alto, CA (US); Jorge Padilla, Union City, CA (US); Christopher Gregory Malone, Mountain View, CA (US)

(73) Assignee: Google LLC, Mountain View, CA (US)

( * ) Notice: Subject to any disclaimer, the term of this patent is extended or adjusted under 35 U.S.C. 154(b) by 88 days.

(21) Appl. No.: 16/441,998

(22) Filed: Jun. 14, 2019

(65) Prior Publication Data

US 2020/0373222 A1    Nov. 26, 2020

Related U.S. Application Data

(60) Provisional application No. 62/852,838, filed on May 24, 2019.

(51) Int. Cl.
*H01L 23/473* (2006.01)
*H01L 23/367* (2006.01)
*H01L 27/02* (2006.01)

(52) U.S. Cl.
CPC .......... *H01L 23/473* (2013.01); *H01L 23/367* (2013.01); *H01L 23/3675* (2013.01); *H01L 27/0211* (2013.01)

(58) Field of Classification Search
None
See application file for complete search history.

(56) References Cited

U.S. PATENT DOCUMENTS 4,715,438 A     12/1987  Gabuzda et al.
4,746,966 A *   5/1988   Fitzgerald ............. H01L 23/528
                                                    257/203

(Continued)

FOREIGN PATENT DOCUMENTS

CN    104813758    7/2015
EP    0 219 668    4/1987

(Continued)

OTHER PUBLICATIONS

TW Office Action in Taiwan Application No. 108143504, dated Jul. 21, 2020, 6 pages (with English translation).

(Continued)

*Primary Examiner* — Andres Munoz
(74) *Attorney, Agent, or Firm* — Fish & Richardson P.C.

(57) ABSTRACT

Methods, systems, and apparatus, including an integrated circuit (IC) with a ring-shaped hot spot area. In one aspect, an IC includes a first area along an outside perimeter of a surface of the IC. The first area defines a first inner perimeter. The IC includes a second area that includes a center of the IC and that includes a first set of components. The second area defines a first outer. The IC includes a ring-shaped hot spot area between the first area and the second area. The ring-shaped hot spot area defines a ring outer perimeter that is juxtaposed with the first inner perimeter. The ring-shaped hot spot area defines a ring inner perimeter that is juxtaposed with the first outer perimeter. The ring-shaped hot spot area includes a second set of components that produce more heat than the first set of components.

20 Claims, 8 Drawing Sheets

(56) References Cited

U.S. PATENT DOCUMENTS

| | | | |
|---|---|---|---|
| 5,014,904 A | 5/1991 | Morton | |
| 5,050,037 A | 9/1991 | Yamamoto et al. | |
| 5,239,200 A | 8/1993 | Messina et al. | |
| 5,497,014 A | 3/1996 | Momose | |
| 6,687,126 B2 | 2/2004 | Patel et al. | |
| 7,301,770 B2* | 11/2007 | Campbell | F28F 3/022 165/80.3 |
| 7,316,263 B2* | 1/2008 | Lofland | F28F 3/12 165/170 |
| 7,331,380 B2* | 2/2008 | Ghosh | H01L 23/473 165/104.33 |
| 8,004,832 B2 | 8/2011 | Brunschwiler et al. | |
| 8,162,035 B2 | 8/2012 | Behrens et al. | |
| 8,833,438 B2 | 9/2014 | Wyatt et al. | |
| 9,263,366 B2* | 2/2016 | Lin | H01L 23/473 |
| 2005/0286227 A1 | 12/2005 | Erturk et al. | |
| 2006/0002087 A1 | 1/2006 | Bezama et al. | |
| 2007/0002536 A1 | 1/2007 | Hall et al. | |
| 2007/0256810 A1* | 11/2007 | Di Stefano | H01L 23/473 165/46 |
| 2008/0261528 A1 | 9/2008 | Rosenblatt | |
| 2009/0213541 A1 | 8/2009 | Butterbaugh et al. | |
| 2009/0316360 A1 | 12/2009 | Campbell et al. | |
| 2010/0200197 A1* | 8/2010 | Bezama | H01L 23/3733 165/84 |
| 2013/0249018 A1 | 9/2013 | Zojer et al. | |
| 2013/0331996 A1 | 12/2013 | Brunschwiler et al. | |
| 2016/0079140 A1 | 3/2016 | Arvelo et al. | |
| 2017/0092565 A1* | 3/2017 | Chen | F28F 3/12 |
| 2017/0147727 A1 | 5/2017 | Bickford et al. | |
| 2017/0310317 A1 | 10/2017 | Bernardon et al. | |

FOREIGN PATENT DOCUMENTS

| | | |
|---|---|---|
| EP | 3373331 | 9/2018 |
| JP | 201505650 | 1/2015 |
| TW | 201709444 | 3/2017 |
| TW | 201909346 | 3/2019 |
| TW | 201913920 | 4/2019 |

OTHER PUBLICATIONS

PCT International Search Report and Written Opinion in International Application No. PCT/US2019/063527, dated Feb. 24, 2020, 15 pages.

* cited by examiner

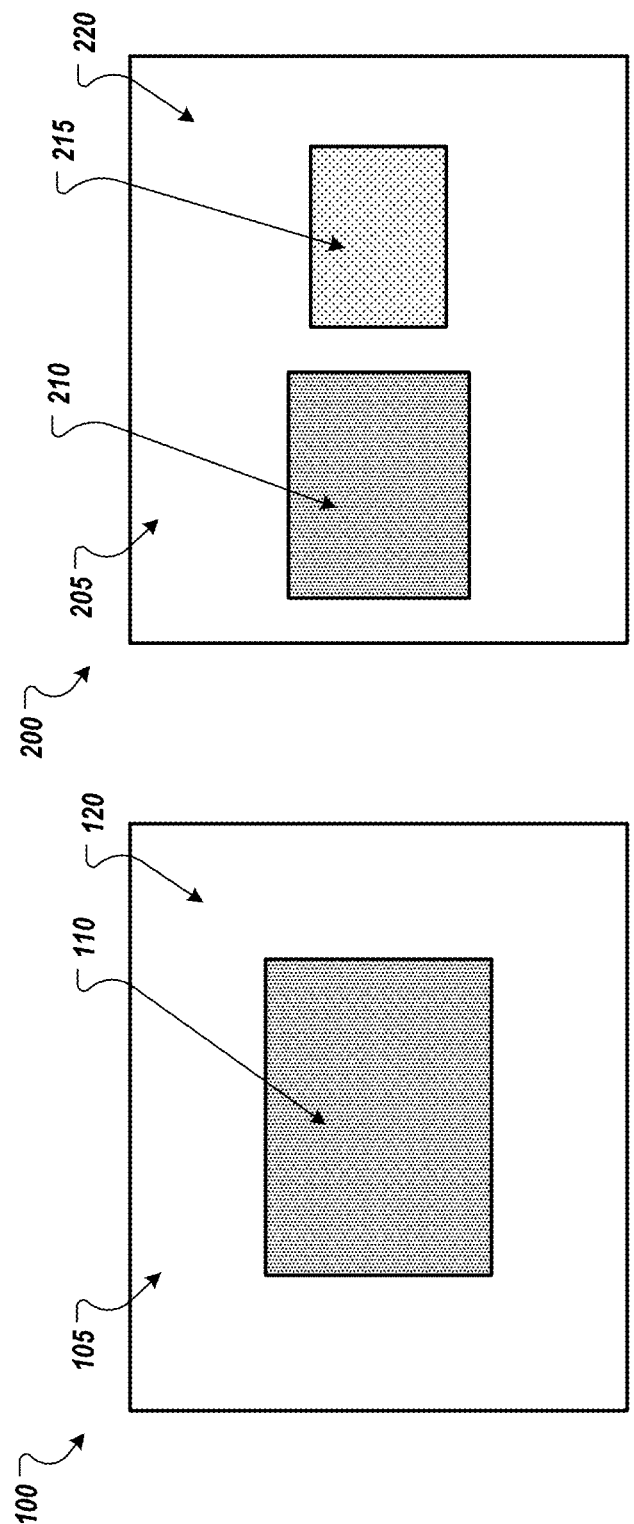

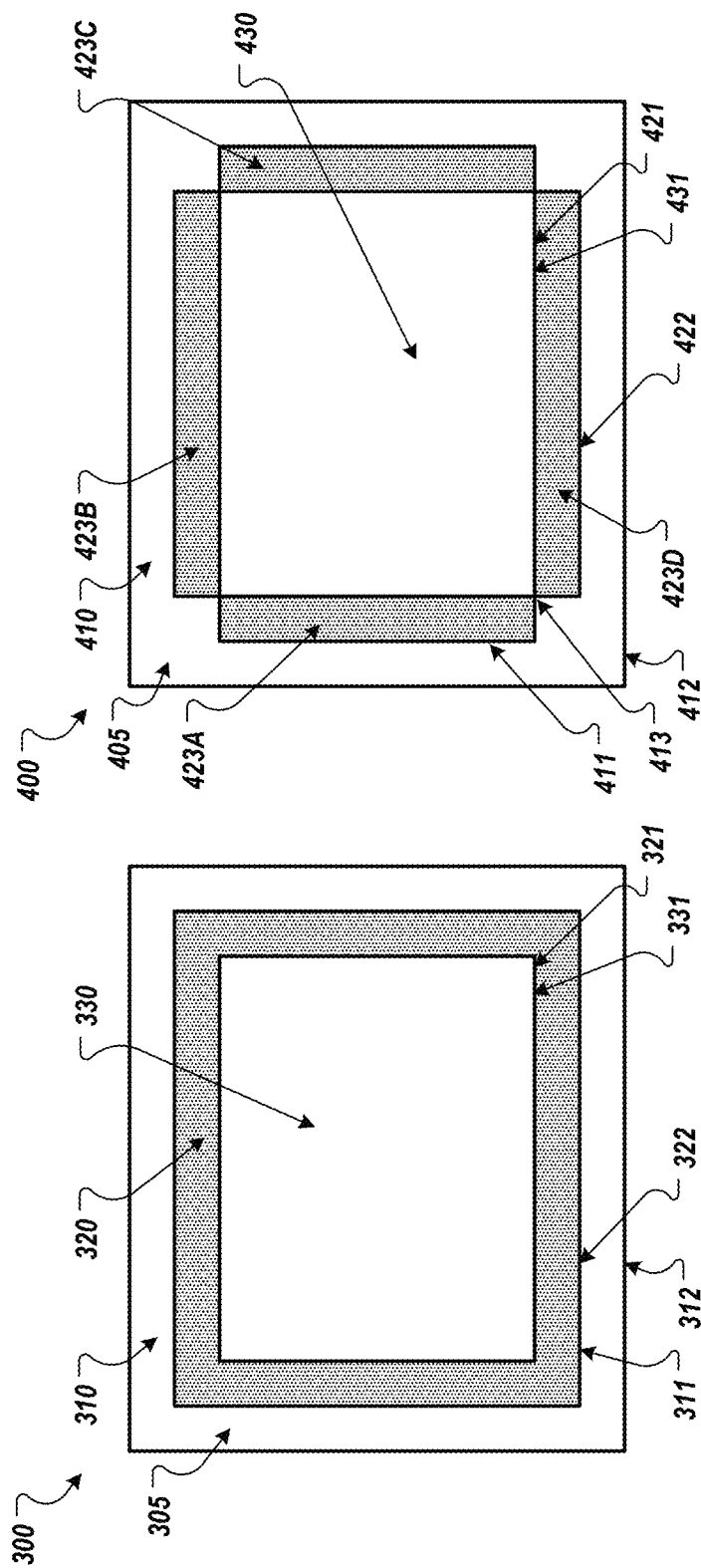

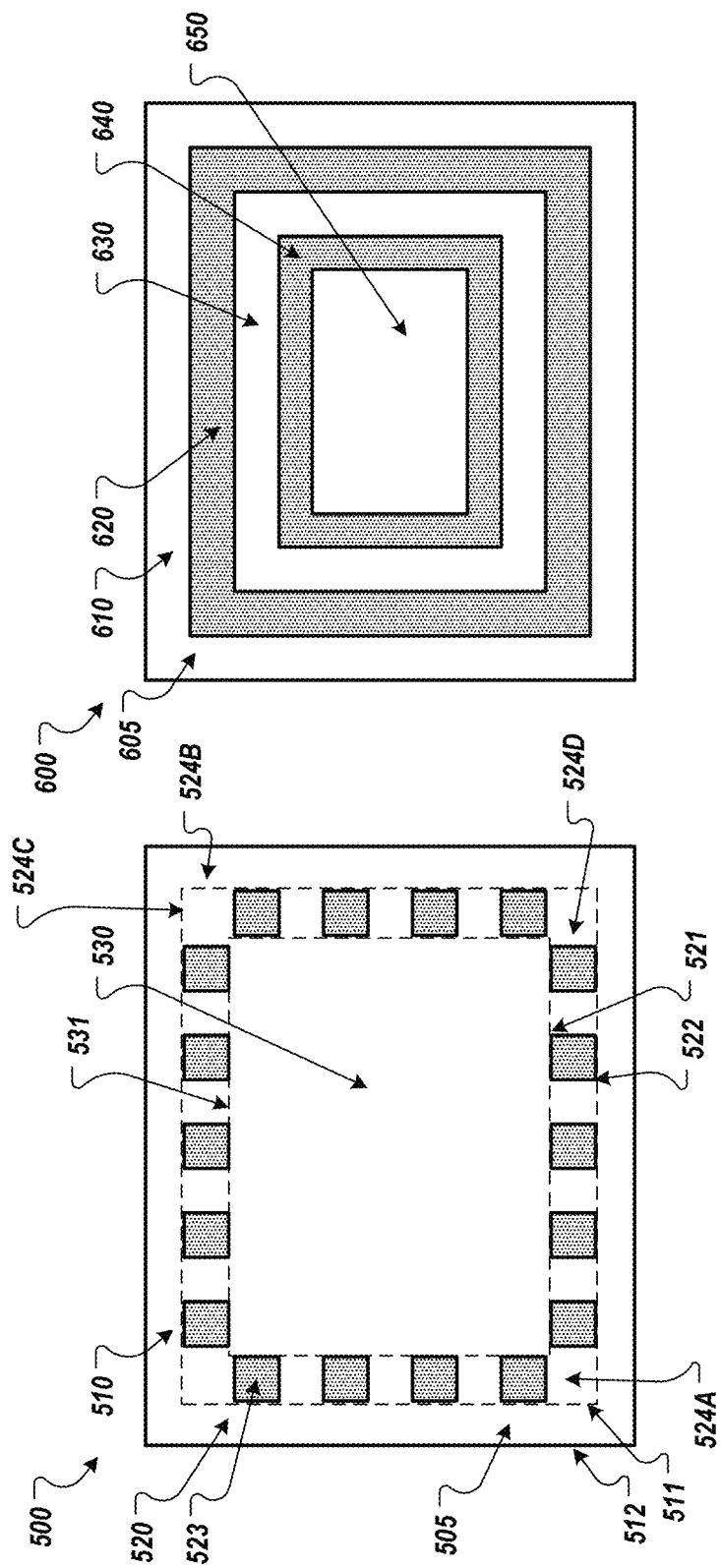

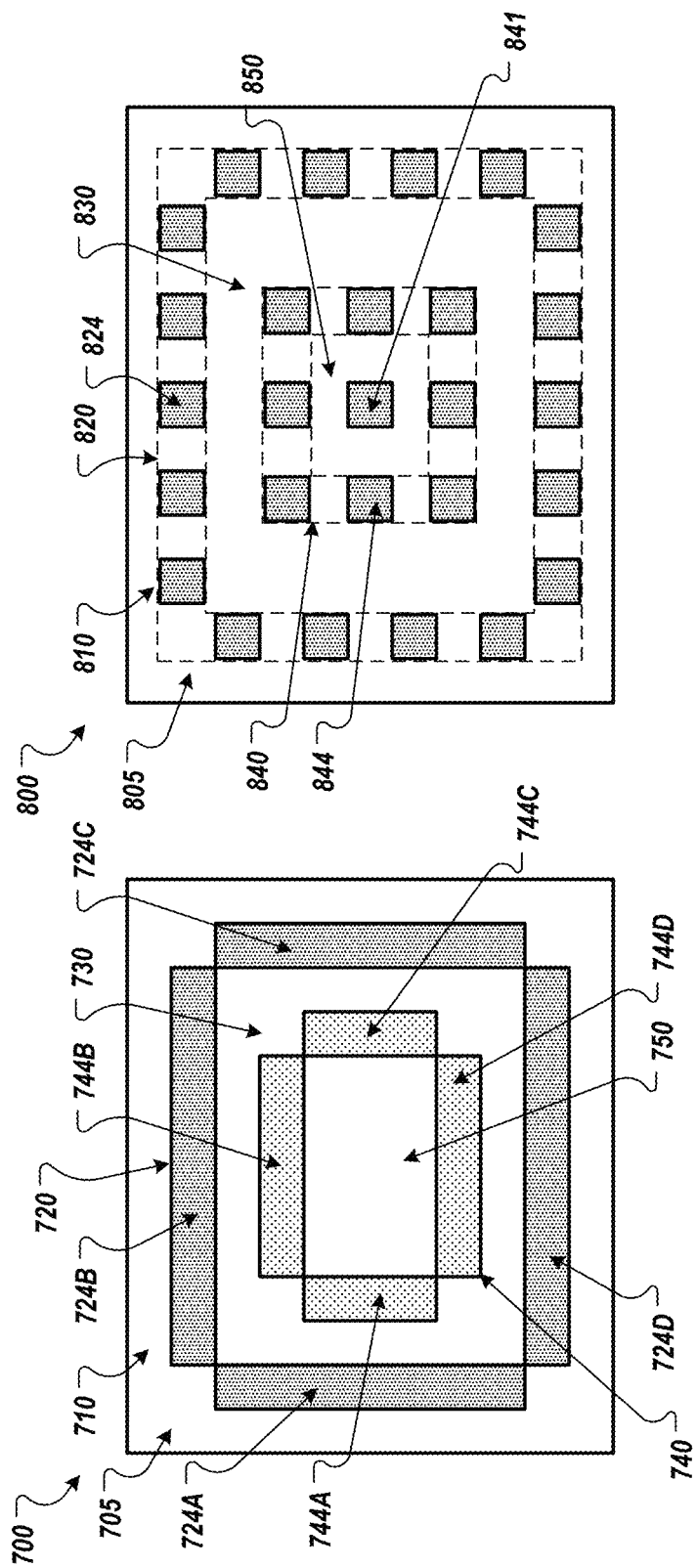

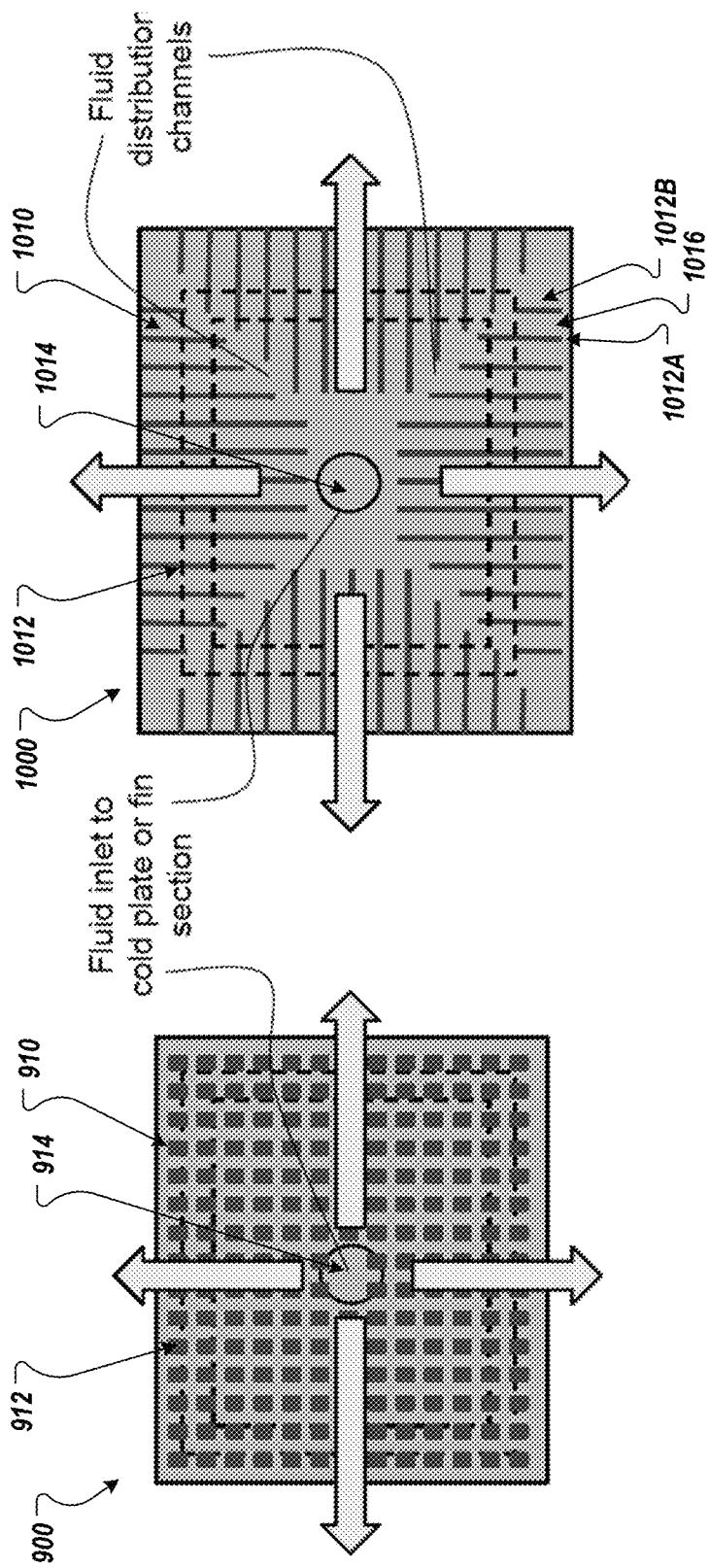

INTEGRATED CIRCUIT WITH A RING-SHAPED HOT SPOT AREA AND MULTIDIRECTIONAL COOLING

CROSS-REFERENCE TO RELATED APPLICATIONS

This application claims the benefit under 35 U.S.C. § 119(e) of U.S. Patent Application No. 62/852,838, entitled "INTEGRATED CIRCUIT WITH A RING CORE AND MULTIDIRECTIONAL COOLING," filed May 24, 2019. The disclosure of the foregoing application is incorporated herein by reference in its entirety for all purposes.

BACKGROUND

An integrated circuit, which is also referred to as a chip, is a collection of electronic circuits fabricated on a thin substrate of semiconductor material. Complementary metal-oxide-semiconductor (CMOS) is a common technology for fabricating integrated circuits, such as microprocessor chips.

With Dennard scaling, the power density of CMOS transistors remained constant as transistors became smaller and the performance of the chips increased. However, with the breakdown of Dennard scaling, the power density of chips continues to increase as the performance of the chips increases. In addition, the exploration of special purpose chips, such as graphics processing units (GPUs) and application-specific integrated circuits (ASICs), will likely result in high power heat sources in servers. Moreover, services such as imaging and artificial intelligence will likely require large amounts of computing resources at a high density (e.g., many servers in close proximity). All of these trends indicate that there is a need for high performance cooling technologies for integrated circuits.

SUMMARY

This specification describes technologies relating to cooling integrated circuits.

In general, one innovative aspect of the subject matter described in this specification can be embodied in integrated circuits that include a first area along an outside perimeter of a first surface of the integrated circuit. The first area defines a first inner perimeter. The integrated circuits include a second area that includes a center of the integrated circuit on the first surface and that includes a first set of electronic component. The second area defines a first outer perimeter that is less than the first inner perimeter and spaced apart from the first inner perimeter. The integrated circuits include a ring-shaped hot spot area disposed between the first area and the second area on the first surface. The ring-shaped hot spot area defines a ring outer perimeter that is juxtaposed with the first inner perimeter of the first area. The ring-shaped hot spot area defines a ring inner perimeter that is juxtaposed with the first outer perimeter of the second area to substantially surround the second area. The ring-shaped hot spot area includes a second set of electronic components that produce more heat than the first set of electronic components during operation of the integrated circuit.

These and other implementations can each optionally include one or more of the following features. In some aspects, the first area, the second area, and the ring-shaped hot spot area are centrally disposed about the center of the integrated circuit on the first surface.

In some aspects, the second set of electronic components include computational components of a microprocessor core of the integrated circuit. The ring-shaped hot spot area can include four rectangular-shaped segments of electronic components that form a continuous rectangular-shaped ring about the second area on the first surface of the integrated circuit.

In some aspects, the ring-shaped hot spot area can include four rectangular-shaped segments of electronic components that form a segmented rectangular ring-shaped hot spot area. The ring-shaped hot spot area can include a set of rectangular-shaped segments that are distributed about the ring-shaped hot spot area and that are spaced apart from each other rectangular-shaped segment and spaces between the rectangular-shaped segments comprise electronic components that produce less heat than electronic components in the rectangular-shaped segments.

In some aspects, the integrated circuits can include a second ring-shaped hot spot area disposed between the ring-shaped hot spot area and the second area. The second ring-shaped hot spot area can substantially surround the second area and include a third set of electronic components that produce more heat than the first set of electronic components. The third set of electronic components can produce a different amount of heat than the second set of electronic components. The second ring-shaped hot spot area comprises four rectangular-shaped segments of electronic components that form a continuous hollow box-shaped area around the second area.

In some aspects, the second ring-shaped hot spot area can include four rectangular-shaped segments of electronic components that form a segmented rectangular ring-shaped hot spot area. The second ring-shaped hot spot area can include a set of rectangular-shaped segments that are distributed about the second ring-shaped hot spot area and that are spaced apart from each other rectangular-shaped segment. Spaces between the rectangular-shaped segments can include electronic components that produce less heat than electronic components in the rectangular-shaped segments.

In some aspects, the integrated circuits can include a fin array cold plate that passes a cooling liquid in multiple directions over a base of the cold plate disposed over the ring-shaped hot spot area such that the cooling liquid passes over the ring-shaped hot spot area. The fin array cold plate can include a pin-fin array cold plate or a plate-fin array cold plate. The fin array cold plate passes the cooling liquid in four lateral directions over the ring-shaped hot spot area. The fin array cold plate can be configured to provide one or more of (i) outside-in cooling liquid flow in a direction from one or more sides of the outside perimeter of the integrated circuit towards the center of the integrated circuit or (ii) inside-out cooling liquid flow in a direction from the center of the integrated circuit towards the one or more sides of the outside perimeter of the integrated circuit.

In some aspects, the fin array cold plate can include a symmetric distribution point that provides uniform cooling. In some aspects, the integrated circuits can include a second ring-shaped hot spot area disposed between the ring-shaped hot spot area and the second area. The second ring-shaped hot spot area can substantially surround the second area and can include a fourth set of electronic components that produce more heat than the first set of electronic components and the second set of electronic components. The fin array cold plate can pass the cooling liquid over both the ring-shaped hot spot area and the second ring-shaped hot spot area.

In general, another aspect of the subject matter described in this specification can be embodied in integrated circuits that include a first area along an outside perimeter of a first surface of the integrated circuit. The first area defines a first inner perimeter. The integrated circuits include a second area that includes a center of the integrated circuit on the first surface and that includes a first set of electronic components. The second area defines a first outer perimeter that is less than the first inner perimeter and spaced apart from the first inner perimeter. The integrated circuits include a ring-shaped hot spot area disposed between the first area and the second area on the first surface. The ring-shaped hot spot area defines a ring outer perimeter that is juxtaposed with the first inner perimeter of the first area. The ring-shaped hot spot area defines a ring inner perimeter that is juxtaposed with the first outer perimeter of the second area to substantially surround the second area. The ring-shaped hot spot area includes a second set of electronic components that have a higher power density than the first set of electronic components.

In some aspects, the ring-shaped hot spot area includes four rectangular-shaped segments of electronic components that form a continuous rectangular-shaped ring about the second area on the first surface of the integrated circuit.

In general, another aspect of the subject matter described in this specification can be embodied in integrated circuits that include a first area along an outside perimeter of a first surface of the integrated circuit. The first area defines a first inner perimeter. The integrated circuits include a second area that includes a center of the integrated circuit on the first surface and that includes a first set of electronic components. The second area defines a first outer perimeter that is less than the first inner perimeter and spaced apart from the first inner perimeter. The integrated circuits include a first ring-shaped hot spot area and a second ring-shaped hot spot area disposed between the first area and the second area on the first surface. The first ring-shaped hot spot area defines a first ring outer perimeter that is juxtaposed with the first inner perimeter of the first area. The first ring-shaped hot spot area defines a first ring inner perimeter that is juxtaposed with a second ring outer perimeter of the second ring-shaped hot spot area to substantially surround the second ring-shaped hot spot area. The first ring-shaped hot spot area includes a second set of electronic components that have a higher power density than the first set of electronic components. The second ring-shaped hot spot area defines the second ring outer perimeter. The second ring-shaped hot spot area defines a second ring inner perimeter that is juxtaposed with the first outer perimeter of the second area to substantially surround the second area. The second ring-shaped hot spot area includes a third set of electronic components that have a higher power density than the first set of electronic components.

The subject matter described in this specification can be implemented in particular embodiments so as to realize one or more of the following advantages. Arranging hot spots of integrated circuits, e.g., circuit components that have a higher power density than other circuit components, in a ring-shaped area provides better temperature regulation (e.g., greater heat dissipation from the integrated circuit) than conventional core layouts. This greater heat dissipation allows for higher performance and higher power density electronic components to be fabricated on smaller integrated circuits.

Increasing the perimeter of the ring-shaped hot spot area relative to the area of the ring-shaped hot spot area can provide even more heat dissipation. Arranging the electrical components within the ring-shaped hot spot area in spaced apart core portions can further improve heat dissipation by increasing the overall perimeter to area ratio of the ring-shaped hot spot area.

A cold plate that provides multidirectional cooling can improve the heat dissipation by moving a cooling liquid across each side of the ring-shaped hot spot area. The cold plate can be configured for inside-out or outside-in cooling liquid flow such that the cooling liquid passes across the hotter areas of a chip first, providing better cooling performance. This multidirectional cooling can provide uniform cooling to each region of the ring-shaped hot spot core (e.g., providing the same (or similar) coolant temperature above each region of the ring-shaped hot spot area).

Various features and advantages of the foregoing subject matter is described below with respect to the figures. Additional features and advantages are apparent from the subject matter described herein and the claims.

BRIEF DESCRIPTION OF THE DRAWINGS

FIG. 1 is a block diagram of an example chip with a hot spot area.

FIG. 2 is a block diagram of an example chip with two hot spot areas.

FIG. 3 is a block diagram of an example chip with a ring-shaped hot spot area.

FIG. 4 is a block diagram of an example chip with a segmented ring-shaped hot spot area.

FIG. 5 is a block diagram of another example chip with a segmented ring-shaped hot spot area.

FIG. 6 is a block diagram of an example chip with ring-shaped hot spot areas.

FIG. 7 is a block diagram of an example chip with segmented ring-shaped hot spot areas.

FIG. 8 is a block diagram of an example chip with segmented ring-shaped hot spot areas.

FIG. 9 is a block diagram of an example chip with a cold plate that provides multidirectional cooling.

FIG. 10 is a block diagram of another example chip with a cold plate that provides multidirectional cooling.

Like reference numbers and designations in the various drawings indicate like elements.

DETAILED DESCRIPTION

Figure 11:
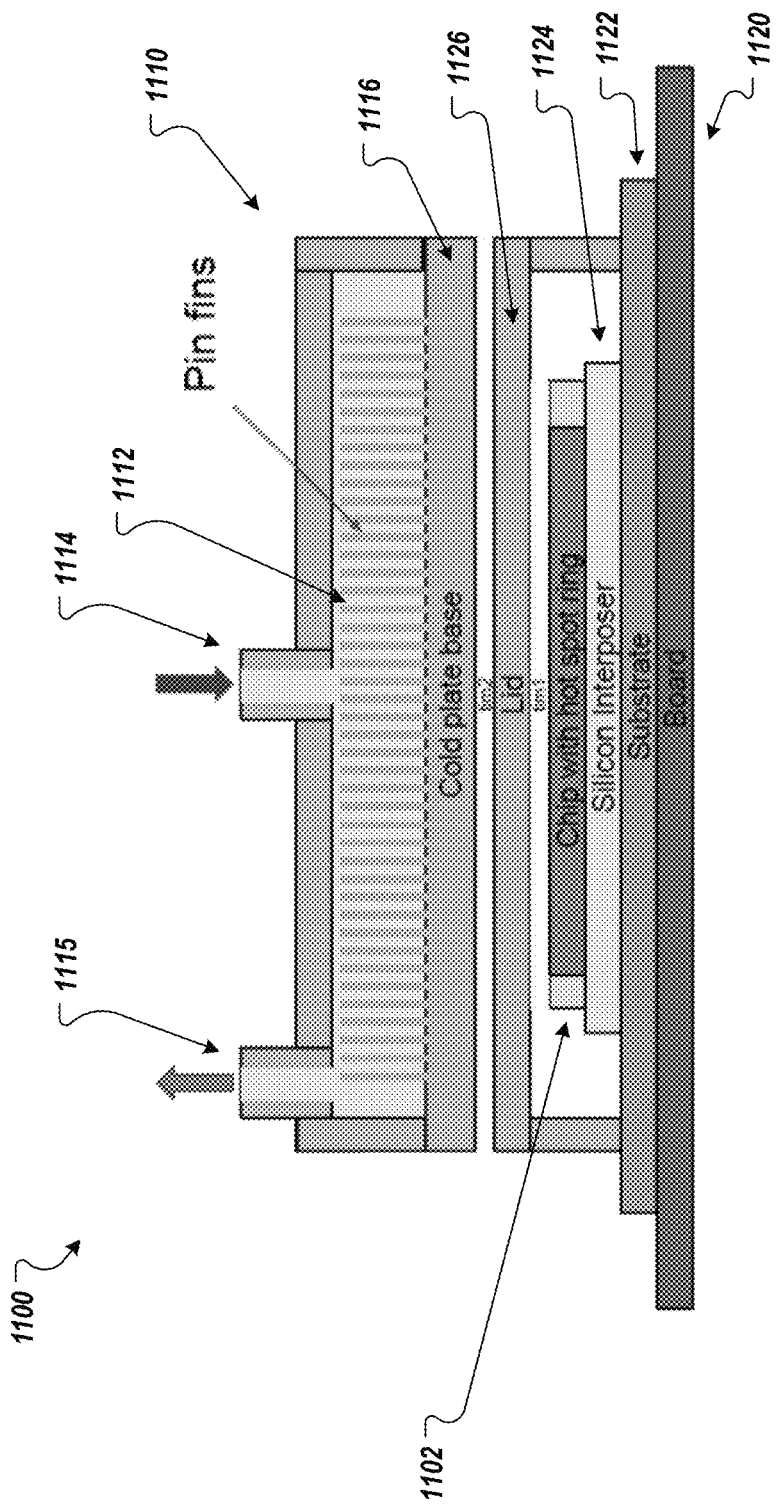
FIG. 11 illustrates an example chip package that includes a chip and a cold plate.

In general, systems and techniques described herein relate to cooling integrated circuits (also referred to herein as chips). The electronic components of the chips can be arranged based on their thermal characteristics, e.g., based on their power density and/or amount of heat produced by the components when the chip is operating. The electronic components can include active devices, e.g., transistors and diodes, and inactive devices, e.g., capacitors and resistors. The chips can also include conductive traces that electrically connect the electronic components.

Higher power density components produce more heat per unit volume than lower power density components. Some groups of electronic components, e.g., individual circuits, have a higher power density than other groups of electronic components. For example, computation circuits such as matrix multiplication circuits of machine learning processors may have a higher power density than a basic two-input adder or basic memory circuit.

The higher power density components and/or groups of components can be arranged in one or more ring-shaped hot spot areas that each have a ring geometric shape, e.g., a rectangular or round hollow ring geometric shape that provides better cooling for these components. A hot spot area is an area of a chip that has a higher power density than other areas of the chip. A hollow ring geometric shape is a shape in which the ring-shaped hot spot area substantially surrounds an area of a surface of the chip that produces less heat (e.g., at least a threshold amount less heat) than the ring-shaped hot spot area during operation of the integrated circuit.

A cold plate can also be attached to the chip to provide additional cooling. The cold plate can be configured to pass a cooling fluid (e.g., cold water or other appropriate cooling liquid or gas) in multiple directions across the ring-shaped hot spot area(s). For example, the cold plate can be configured to pass a cooling fluid in four directions across a rectangular-shaped chip, e.g., towards or away from each lateral side of the chip.

The cold plate can be configured to pass the cooling fluid in a particular direction (e.g., inside-out or outside-in) based on the arrangement of the ring-shaped hot spot areas. For example, a chip can include an inner ring-shaped hot spot area nested within an outer ring-shaped hot spot area. The two ring-shaped hot spot areas can have different thermal characteristics. For example, one of the cores may produce more heat than the other during operation of the chip (e.g., when the chip is receiving power and processing data). The cold plate can be configured to pass the cooling fluid across (e.g., over or under) the core that produces the most heat first and then across the core that produces less heat to provide better overall cooling for the chip. If the inner ring-shaped hot spot area produces more heat than the outer ring-shaped hot spot area, the cold plate can be configured to pass the cooling fluid across the cores in an inside-out direction, e.g., from the center of the chip to each side of the chip. If the outer ring-shaped hot spot area produces more heat than the inner ring-shaped hot spot area, the cold plate can be configured to pass the cooling fluid across the cores in an outside-in direction, e.g., from each side of the chip to the center of the chip.

FIG. 1 is a block diagram of an example chip 100 with a hot spot area 110. In this example, the chip 100 includes a single hot spot area 110 that is located in the center of a surface 105 of the chip 100. Although only one surface 105 is shown in FIG. 1, the hot spot area 110 can occupy the same area of the surfaces of multiple layers of the chip. The hot spot area 110 can include a processor core and/or other electronic components that have high power density (e.g., at least a threshold power density).

The surface 105 also includes an area 120 around the hot spot area 110 that can include other electronic components that have a lower power density (e.g., less than the threshold power density) than the hot spot area 110. For example, the hot spot area 110 can have a higher power density (or average or total amount of heat produced) per unit area of the surface 105 (or per unit volume of the portion of the chip 100 occupied by the hot spot core) than the area 120 (or volume consumed by the same area of multiple layers of the chip 100) due to the higher power density components located in the hot spot areal 10.

FIG. 2 is a block diagram of an example chip 200 with two hot spot area 210 and 215. The hot spot area 210 and 215 are located on one or more surfaces, including the surface 205, of the chip 200. For example, the chip 200 can include a dual core processor with two processing cores, one located in the hot spot area 210 and one located in the hot spot area 215.

The hot spot areas 210 and 215 can have the same or different thermal characteristics. That is, the hot spot area 210 can produce a different amount of heat than the hot spot area 215 during operation of the chip 200. For example, the hot spot area 210 may produce more heat per unit area of the surface 205 than the hot spot area 215. Both hot spot areas 210 and 215 can also produce more heat per unit area of the surface 205 than an area 220 of the surface 220 around the hot spot area 210 and 215.

FIG. 3 is a block diagram of an example chip with a ring-shaped hot spot area 320. The ring-shaped hot spot area 320 is located on a surface 305 of the chip 300. The ring-shaped hot spot area 320 can also occupy the same area of multiple other surfaces of other layers of the chip 300. For example, the ring-shaped hot spot area 320 can include electronic components formed on multiple layers of the chip 300, with the layer 305 being one of those layers. The layers can be arranged on top of one another such that the ring-shaped hot spot area 320 is in the same location on the surface of each layer that includes electronic components of the ring-shaped hot spot area 320.

The ring-shaped hot spot area 320 is disposed between an outer area (also referred to herein as a first area) 310 of the surface 305 and an inner area (also referred to herein as a second area) 330 of the surface 305. The outer area 310 is along an outside perimeter 312 of the surface 305 and defines an inner perimeter 311. That is, the outer area 310 is the area around the surface 305 that is between the outer perimeter 312 and the inner perimeter 311. In some implementations, the outer area 310 does not include any electronic components. That is, the outer area 310 may be formed of the substrate of the chip 300. In some implementations, the outer area 310 includes low power density electronic components, as described below.

The inner area 330 of the surface 305 includes the center of the surface 305 and defines an outer perimeter 331. That is, the inner area 330 is the area of the surface 305 bounded by the outer perimeter 331 and that includes the center of the surface 305. Like the ring-shaped hot spot area 320, the outer area 310 and the inner area 330 can be in the same location on the surface of multiple layers of the chip 300. In some implementations, the inner area 330 does not include any electronic components. That is, the inner area 330 may be formed of the substrate of the chip 300. In some implementations, the inner area 330 includes low power density electronic components, as described below.

In this example, the ring-shaped hot spot area 320 includes four rectangular-shaped segments that form a continuous rectangular-shaped ring around the inner area 330. However, other geometric shapes, e.g., circles, triangles, pentagons, etc., are also possible. The ring-shaped hot spot area 320 is also a hollow ring-shaped hot spot area as the ring-shaped hot spot area 320 has a higher power density and/or produces more heat than the inner area 330 during operation of the chip 300, as described below. In this example, the ring-shaped hot spot area 320, the inner area 330, and the outer area 340 are all centrally disposed about the center of the surface 305 of the chip 300. That is, the center of the ring-shaped hot spot area 320, the inner area 330, and the outer area 340 are aligned to the center of the surface 305.

The ring-shaped hot spot area 320 defines a ring inner perimeter 321 that is juxtaposed with the outer perimeter 331 of the inner area 330. The ring-shaped hot spot area 320 also defines a ring outer perimeter 322 that is juxtaposed with the inner perimeter 311 defined by the outer area 310. In this example, the ring-shaped hot spot area 320 surrounds the inner area 330 on the surface 305 of the chip 300. Similarly, the outer area 310 surrounds the ring-shaped hot spot area 320.

The electronic components of the ring-shaped hot spot area 320 are arranged between the ring inner perimeter 321 and the ring outer perimeter 322. For example, the electronic components of the ring-shaped hot spot area 320 can be distributed throughout the ring-shaped hot spot area 320 and between the ring inner perimeter 321 and the ring outer perimeter 322 on each layer of the chip 300 occupied by the ring-shaped hot spot area 320.

The electronic components and/or groups of electronic components (e.g., individual circuits) of the chip 300 that have higher power densities can be arranged within the ring-shaped hot spot area 320. For example, electronic components and/or groups of electronic components that have at least a threshold power density or that produce at least a threshold amount of heat during operation of the chip 300 can be arranged in the ring-shaped hot spot area 320 rather than in the inner area 330 or outer area 310. Electronic components and/or groups of electronic components that have less than the threshold power density or that produce less than the threshold amount of heat during operation of the chip 300 can be arranged in the inner area 330 and/or the outer area 310.

As an example, the inner area 330 and/or outer area 310 can include conductive traces that pass electronic signals between electronic components of the ring-shaped hot spot area 320, but does not include computational circuits, e.g., matrix multipliers, microprocessors, etc. that have higher power density than the electronic traces. In another example, the inner area 330 can include memory circuits and other circuits that have a lower power density than computational circuits included in the ring-shaped hot spot area 320.

In another example, the electronic components of the chip 300 can be arranged such that the electronic components or groups of electronic components that have higher power densities are located in the ring-shaped hot spot area 320 and the electronic components or groups of electronic components with lower power densities are located in the inner area 330 and/or outer area 310. For example, the electronic components and/or groups of electronic components can be ordered, e.g., ranked, based on power density. The higher power density components can then be located in the ring-shaped hot spot area 320, e.g., until the space allocated for the ring-shaped hot spot area 320 is filled. The remaining lower power density components can then be located in the inner area 330 and/or the outer area 310.

In another example, the size of the ring-shaped hot spot area 320 can be determined based on the number and size of the electronic components and/or groups of electronic components that are classified as high power density components or high power density groups of electronic components. For example, an electronic component or group of electronic components can be classified as high power density if its power density satisfies (e.g., meets or exceeds a threshold power density). These high power density electronic components and/or groups can then be arranged in the ring-shaped hot spot area 320. The other non-high power density electronic components or groups can be arranged in the inner area 330 or the outer area 310.

In another example, the electronic components of the ring-shaped hot spot area 320, the inner area 330 (if it includes any electronic components), and the outer area 310 (if it includes any electronic components) are arranged such that the ring-shaped hot spot area 320 has at least a threshold amount higher power density (and/or produces at least a threshold amount of more heat) than the inner area 330 and the outer area 310 during operation of the chip. For example, more electronic components can be arranged in the ring-shaped hot spot area 320 and/or the electronic components may be more densely arranged in the ring-shaped hot spot area 320 than in the inner area 330 and the outer area 310.

In some implementations, the electronic components of the ring-shaped hot spot area 320 are arranged such that the thermal characteristics of the ring-shaped hot spot area 320 are consistent or uniform throughout the ring-shaped hot spot area 320. For example, the electronic components of the ring-shaped hot spot area 320 can be arranged within the ring-shaped hot spot area 320 such that the average power density of each individual section (e.g., each same or similar sized volumetric portion) of the ring-shaped hot spot area 320 is within a threshold amount of each other section. In another example, the electronic components of the ring-shaped hot spot area 320 can be arranged within the ring-shaped hot spot area 320 such that the average amount of heat produced by each individual section of the ring-shaped hot spot area 320 is within a threshold amount of each other section. The electronic components of the inner area 330 (if any) and the outer area 310 (if any) can also be arranged to have consistent thermal characteristics throughout those areas.

In some implementations, the ring-shaped hot spot area 320 can include multiple processor cores or multiple other computational units. For example, each of the four rectangular-shaped segments can include a processor core. The circuitry of each core can be arranged within its segment. Electrical traces and lower power density circuits for the cores, e.g., memory circuits, buses, and/or other auxiliary circuits, can be arranged in the inner area 330 and/or the outer area 310 of the chip 300. In another example, the ring-shaped hot spot area 320 can include a single multiprocessor core or another appropriate number of processor cores arranged along the ring-shaped hot spot area 320.

The ring-shaped hot spot area 320 arrangement of higher power density components provides better cooling for the chip 300 than the clustered arrangements of FIGS. 1 and 2. For example, the ring-shaped hot spot area 320 has a larger perimeter to area ratio than the cores 110, 210, and 215 of FIGS. 1 and 2. In addition, the ring-shaped hot spot area 320 has more sides to which heat can dissipate (e.g., the heat can spread in towards the inner area 330 and out towards the outer area 310) than the cores 110, 210, and 215 (just out from the perimeter of these cores). These characteristics allow for heat to dissipate from the ring-shaped hot spot area 320 at a faster rate than the cores 110, 210, and 215 because they provide a larger area from which the heat can dissipate. To further improve the heat dissipation, the four rectangular-shaped segments can have a high aspect ratio of length to width of the segments. A higher aspect ratio provides a larger area of the sides from which the heat can dissipate relative to the total area of the ring-shaped hot spot area 320, providing better cooling of the ring-shaped hot spot area 320.

Using a ring-shaped hot spot area arrangement, such as the ring-shaped hot spot area 320, provides better cooling than a clustered core (e.g., the cores 110, 210, and 215) that has the same total area. Thus, the ring-shaped hot spot area arrangement can provide better cooling without sacrificing the usable area of the chip. This allows for more for higher density arrangements of electronic components in chips without an increase in the amount of heat subjected to the components. As described below, a cold plate can also be attached to the chip 300 to provide more cooling for the ring-shaped hot spot area 320 and the chip 300 as a whole.

FIGS. 4-8 illustrate different arrangements of ring-shaped hot spot areas on chips. In each of these arrangements, the electronic components can be arranged in a similar manner such that the power density of and/or the amount of heat produced by the ring-shaped hot spot areas is greater than that of the inner and outer areas of the chips to provide better cooling for the electronic components of the ring-shaped hot spot areas and the chips themselves. The selection of electronic components for the ring-shaped hot spot area and the other areas, and how they are arranged, can be similar to the ways in which the electronic components are selected and arranged on the chip 300.

FIG. 4 is a block diagram of an example chip 400 with a segmented ring-shaped hot spot area 420. The segmented ring-shaped hot spot area 420 is located on a surface 405 of the chip 400. The segmented ring-shaped hot spot area 420 can also occupy the same area of multiple other surfaces of other layers of the chip 400. For example, the segmented ring-shaped hot spot area 420 can include electronic components formed on multiple layers of the chip 400, with the layer 405 being one of those layers.

The segmented ring-shaped hot spot area 420 is disposed between an outer area 410 of the surface 405 and an inner area 430 of the surface 405. The outer area 410 is along an outside perimeter 412 of the surface 405 and defines an inner perimeter 411. In this example, the inner perimeter 411 is not square-shaped. Instead, the inner perimeter 411 includes four inward-pointing corners (e.g. the corner 413) based on the shape and arrangement of the segmented ring-shaped hot spot area 420. Similar to the outer area 310 of the chip 300, the outer area 410 can include electronic components or may not include electronic components.

The inner area 430 of the surface 405 includes the center of the surface 405 and defines an outer perimeter 431. That is, the inner area 430 is the area of the surface 405 bounded by the outer perimeter 431 and that includes the center of the surface 405. The outer area 410 and the inner area 430 can be in the same location on the surface of multiple layers of the chip 400. Similar to the inner area 330 of the chip 300, the inner area 430 can include electronic components or may not include electronic components.

In this example, the segmented ring-shaped hot spot area 420 includes four rectangular-shaped segments 423A-423D. Rather than forming a continuous rectangular-shaped ring around the inner area 430 like the ring-shaped hot spot area 320 of FIG. 3, the four segments 423A-423D form segmented rectangular-shaped ring as the segments 423A-423D only meet at their inner corners. The ring-shaped hot spot area 420 is also a hollow ring-shaped hot spot area as the ring-shaped hot spot area 420 has a higher power density and/or produces more heat than the inner area 430 during operation of the chip 400. In this example, the segmented ring-shaped hot spot area 420, the inner area 430, and the outer area 410 are all centrally disposed about the center of the surface 405 of the chip 400.

The segmented ring-shaped hot spot area 420 defines a ring inner perimeter 421 that is juxtaposed with the outer perimeter 431 of the inner area 430. The segmented ring-shaped hot spot area 420 also defines a ring outer perimeter 422 that is juxtaposed with the inner perimeter 411 defined by the outer area 410. Thus, the ring outer perimeter 422 also has inward-pointing corners that are juxtaposed with the inner-pointing corners of the inner perimeter 411, such as the corner 413.

In this example, the segmented ring-shaped hot spot area 420 surrounds the inner area 430 on the surface 405 of the chip 400. Similarly, the outer area 410 surrounds the segmented ring-shaped hot spot area 420. However, the segments 423A-423D can be spaced apart a distance such that the inner corners do not meet. In this example, the segmented ring-shaped hot spot area 420 would not completely surround the inner area 430. The segmented ring-shaped hot spot area 420 may still substantially surround the inner area 430. For example, a segmented ring-shaped hot spot area may be considered to substantially surround an inner area if the ring-shaped hot spot area includes one or more segments on each side of the inner area and the segments are juxtaposed with at least a threshold percentage (e.g., 50%) of the outer perimeter 431 defined by the inner area 430.

The electronic components of the segmented ring-shaped hot spot area 420 are arranged between the ring inner perimeter 421 and the ring outer perimeter 422. For example, the electronic components of the ring-shaped hot spot area 420 can be distributed throughout the ring-shaped hot spot area 420 and between the ring inner perimeter 421 and the ring outer perimeter 422 on each layer of the chip 400 occupied by the segmented ring-shaped hot spot area 420.

As described above, the electronic components of the chip 400 can be arranged such that the power density of and/or the amount of heat produced by the segmented ring-shaped hot spot area 420 is greater than that of the inner area 430 and outer area 410 of the chip 400 to provide better cooling for the electronic components of the segmented ring-shaped hot spot area 420 and the chip 400 as a whole. In some implementations, the electronic components are arranged in each segment 423A-423D such that each segment has the same or similar thermal characteristics. For example, the electronic components and/or group of electronic components can be selected for and arranged in each segment 423A-423D such that each segment 423A-423D has the same power density or power densities within a threshold amount of each other.

In another example, the electronic components can be selected for and arranged in each segment 423-423D such that the segments 423A-423D have different thermal characteristics. For example, if a cold plate can only be configured to pass cooling fluid across one or two of the segments (e.g., the segments 423B and 423D or the segments 423A and 423C), the segments across which the cooling fluid will flow can have a higher power density than the other segments.

FIG. 5 is a block diagram of another example chip 500 with a segmented ring-shaped hot spot area 520. The segmented ring-shaped hot spot area 520 is located on a surface 505 of the chip 500. As described below, the segmented ring-shaped hot spot area 520 is made of a set of rectangular-shaped (e.g., square-shaped) cores 523 distributed about the ring-shaped hot spot area 520 and that are spaced apart from each other. The cores 523 can be in other shapes, e.g., circles, triangles, pentagons, etc.

The segmented ring-shaped hot spot area 520 is disposed between an outer area 510 of the surface 505 and an inner area 530 of the surface 505. The outer area 510 is along an outside perimeter 512 of the surface 505 and defines an inner perimeter 511. In this example, the inner perimeter 511 is square-shaped. Instead, the inner perimeter 511 could include four inward-pointing corners similar to the inner perimeter 411 of FIG. 4. Similar to the outer area 310 of the chip 300, the outer area 510 can include electronic components or may not include electronic components.

The inner area 530 of the surface 505 includes the center of the surface 505 and defines an outer perimeter 531. That is, the inner area 530 is the area of the surface 505 bounded by the outer perimeter 531 and that includes the center of the surface 505. The outer area 510 and the inner area 530 can be in the same location on the surface of multiple layers of the chip 500. Similar to the inner area 330 of the chip 300, the inner area 530 can include electronic components or may not include electronic components.

In this example, the segmented ring-shaped hot spot area 520 is a rectangular ring-shaped hot spot area that includes four regions 524A-524D that each include multiple hot spot segments 523. Each region 524A-524D can include the same number or different numbers of segment 523. In the illustrated example, the regions 524A and 524C each include four segments 523 and the regions 524B and 524D each include five segments.

The segmented ring-shaped hot spot area 520 can also occupy the same area of multiple other surfaces of other layers of the chip 500. For example, the ring-shaped hot spot area 520 can include electronic components formed on multiple layers of the chip 500, with the layer 505 being one of those layers. The segmented ring-shaped hot spot area 520 can have the same arrangement of segments 523 on each layer.

An inner side of each segment 523 of the segmented ring-shaped hot spot area 520 defines a ring inner perimeter 521 that is juxtaposed with the outer perimeter 531 of the inner area 530. For example, a line through the inner side of each segment 523 in a region 524A-524D defines the ring inner perimeter 521 on that side of the segmented ring-shaped hot spot area 520. An outer side of each segment 523 of the ring-shaped hot spot area 520 defines a ring outer perimeter 522 that is juxtaposed with the inner perimeter 511 defined by the outer area 510. For example, a line through the outer side of each segment 523 in a region 524A-524D defines the ring outer perimeter 522 on that side of the segmented ring-shaped hot spot area 520.

The segmented ring-shaped hot spot area 520 substantially surrounds the inner area 530 as the segmented ring-shaped hot spot area 520 includes one or more regions 524A-524D of segments 523 on each side of the inner area 530 and the segments 523 are juxtaposed with at least a threshold percentage (e.g., 50%) of the outer perimeter 531 defined by the inner area 530. That is the inner sides of the segments 523 cover (e.g., are located adjacent to) more than 50% of the outer perimeter 531.

The segments 523 are distributed between the ring inner perimeter 521 and the ring outer perimeter 522. In some implementations, the segments 523 in each region 524A-524D are spaced apart at equal distances along the region 524A-524D. In some implementations, the segments 523 of each region 524A-524D are spaced apart at different distances, e.g., the segments 523 may be located closer to the middle of each region 524A-524D or closer to the ends of each region 524A-524D based on the location of the cooling fluid flow of a cold plate attached to the chip 500. That is, the segments 523 can be located along the regions 524A-524D such that the cooling fluid of the cold plate passes across at least a portion of each segment 523 or within a threshold distance of each core.

The electronic components of the segmented ring-shaped hot spot area 520 are arranged within the segments 523. For example, the electronic components of the ring-shaped hot spot area 520 can be arranged in the segments 523 on each layer of the chip 500 occupied by the segmented ring-shaped hot spot area 520.

As described above, the electronic components of the chip 500 can be arranged such that the power density of and/or the amount of heat produced by the segmented ring-shaped hot spot area 520 is greater than that of the inner area 530 and outer area 510 of the chip 500 to provide better cooling for the electronic components of the segmented ring-shaped hot spot area 520 and the chip 500 as a whole. In some implementations, the electronic components are arranged in each segment 523 such that each segment 523 has the same or similar thermal characteristics. For example, the electronic components and/or group of electronic components can be selected for and arranged in each segment 523 such that each segment 523 has the same power density or power densities within a threshold amount of each other.

In another example, the electronic components can be selected for and arranged in each segment 523 such that the segments 523 have different thermal characteristics. For example, if a cold plate can only be configured to pass cooling fluid across one or two of the regions (e.g., the regions 524B and 524D or the regions 524A and 524C), the segments 523 in the regions across which the cooling fluid will flow can have a higher power density than the segments 523 in the other regions.

The ring-shaped hot spot area 520 is a hollow ring-shaped hot spot area as the ring-shaped hot spot area 520 has a higher power density and/or produces more heat than the inner area 530 during operation of the chip 500. In this example, the ring-shaped hot spot area 520, the inner area 530, and the outer area 510 are all centrally disposed about the center of the surface 505 of the chip 500.

FIG. 6 is a block diagram of an example chip 600 with ring-shaped hot spot areas 620 and 640. The ring-shaped hot spot areas 620 and 640 are located on a surface 605 of the chip 600. The ring-shaped hot spot area 620 can also occupy the same area of multiple other surfaces of other layers of the chip 600. Similarly, the ring-shaped hot spot area 640 can also occupy the same area of multiple other surfaces of other layers of the chip 600. For example, the ring-shaped hot spot area 620 can include electronic components formed on multiple layers of the chip 600, with the layer 605 being one of those layers.

The ring-shaped hot spot area 620 is disposed between an outer area 610 of the surface 605 and an intermediate area 630 that is between the ring-shaped hot spot area 620 and the ring-shaped hot spot area 640. The ring-shaped hot spot area 640 is disposed between an inner area 650 and the intermediate area 630. Thus, the ring-shaped hot spot area 640 is nested within the ring-shaped hot spot area 620 and the ring-shaped hot spot area 620 surrounds the ring-shaped hot spot area 640 in this example. In this example, the ring-shaped hot spot area 620, the ring-shaped hot spot area 640, the inner area 650, the intermediate area 630, and the outer area 610 are all centrally disposed about the center of the surface 605 of the chip 600.

Each ring-shaped hot spot area 620 and 640 can be the same or similar to the ring-shaped hot spot area 320 of FIG. 3. For example, each ring-shaped hot spot area 620 and 640 can include four rectangular-shaped segments that define perimeters that are juxtaposed with perimeters of the areas bordering the ring-shaped hot spot areas 620 and 640. The width of the segments that form the ring-shaped hot spot area 620 can be wider or thinner than the segments that form the ring-shaped hot spot area 640.

The electronic components of the chip 600 can be arranged such that the power density of and/or the amount of heat produced by the ring-shaped hot spot area 620 and the ring-shaped hot spot area 640 is greater than that of the inner area 650, the intermediate area 630, and the outer area 610 of the chip 600 to provide better cooling for the electronic components of the ring-shaped hot spot area 620, the ring-shaped hot spot area 640, and the chip 600 as a whole. For example, the electronic components and/or groups of electronic components (e.g., individual circuits) of the chip 600 that have higher power densities can be arranged within the ring-shaped hot spot areas 620 and 640. The areas 610, 630, and 650 can either include lower power density electronic components or no electronic components. For example, the intermediate area 630 can include conductive traces that electrically couple computation units (e.g., one or more processor cores) of the ring-shaped hot spot area 640 to computation units (e.g., one or more processor cores) of the ring-shaped hot spot area 620. In a particular example, the ring-shaped hot spot area 620 can include a processor core and the ring-shaped hot spot area 640 can include a processor core.

The ring-shaped hot spot areas 620 and 640 can have the same or different thermal characteristics. For example, the ring-shaped hot spot areas 620 and 640 can have the same power densities or power densities within a threshold amount of each other. In another example, the ring-shaped hot spot area 620 can have a power density that is at least a threshold amount higher or lower than the power density of the ring-shaped hot spot area 640.

The electronic components of each ring-shaped hot spot area 620 and 640 can be arranged such that the thermal characteristics of the ring-shaped hot spot area 620 and 640 are consistent or uniform throughout the ring-shaped hot spot area 620 and 640. For example, the electronic components of the ring-shaped hot spot area 620 can be arranged within the ring-shaped hot spot area 620 such that the average power density of each individual section (e.g., each same or similar sized volumetric portion) of the ring-shaped hot spot area 620 is within a threshold amount of each other section. In another example, the electronic components of the ring-shaped hot spot area 620 can be arranged within the ring-shaped hot spot area 620 such that the average amount of heat produced by each individual section of the ring-shaped hot spot area 620 is within a threshold amount of each other section. The electronic components of the ring-shaped hot spot area 640 can be arranged similarly. The electronic components of the inner area 650 (if any), the intermediate area 630 (if any), and the outer area 610 (if any) can also be arranged to have consistent thermal characteristics throughout those areas.

FIG. 7 is a block diagram of an example chip 700 with segmented ring-shaped hot spot areas 720 and 740. The segmented ring-shaped hot spot areas 720 and 740 are located on a surface 705 of the chip 700. The segmented ring-shaped hot spot area 720 can also occupy the same area of multiple other surfaces of other layers of the chip 700. Similarly, the segmented ring-shaped hot spot area 740 can also occupy the same area of multiple other surfaces of other layers of the chip 700.

The segmented ring-shaped hot spot area 720 is disposed between an outer area 710 of the surface 705 and an intermediate area 730 that is between the segmented ring-shaped hot spot area 720 and the segmented ring-shaped hot spot area 740. The segmented ring-shaped hot spot area 740 is disposed between an inner area 750 and the intermediate area 730. Thus, the segmented ring-shaped hot spot area 740 is nested within the segmented ring-shaped hot spot area 720 and the segmented ring-shaped hot spot area 720 surrounds the segmented ring-shaped hot spot area 740 in this example.

Each segmented ring-shaped hot spot area 720 and 740 can be the same or similar to the ring-shaped hot spot area 420 of FIG. 4. For example, the segmented ring-shaped hot spot area 720 includes four rectangular-shaped segments 724A-724D that define perimeters that are juxtaposed with perimeters defined by the outer area 710 and the intermediate area 730. The segmented ring-shaped hot spot area 740 also includes four segments 744A-744D that are juxtaposed with perimeters defined by the inner area 750 and the intermediate area 730. In this example, the segmented ring-shaped hot spot area 720, the segmented ring-shaped hot spot area 740, the inner area 750, the intermediate area 730, and the outer area 710 are all centrally disposed about the center of the surface 705 of the chip 700.

The electronic components of the chip 700 can be arranged such that the power density of and/or the amount of heat produced by the segmented ring-shaped hot spot area 720 and the segmented ring-shaped hot spot area 740 is greater than that of the inner area 750, the intermediate area 730, and the outer area 710 of the chip 700 to provide better cooling for the electronic components of the segmented ring-shaped hot spot area 720, the segmented ring-shaped hot spot area 740, and the chip 700 as a whole. For example, the electronic components and/or groups of electronic components (e.g., individual circuits) of the chip 700 that have higher power densities can be arranged within the segmented ring-shaped hot spot areas 720 and 740. The areas 710, 730, and 750 can either include lower power density electronic components or no electronic components. For example, the intermediate area 730 can include conductive traces that electrically couple computation units (e.g., one or more processor cores) of the ring-shaped hot spot area 740 to computation units (e.g., one or more processor cores) of the segmented ring-shaped hot spot area 720. In a particular example, the segmented ring-shaped hot spot area 720 can include a processor core and the segmented ring-shaped hot spot area 740 can include a processor core.

The segmented ring-shaped hot spot areas 720 and 740 can have the same or different thermal characteristics. For example, the segmented ring-shaped hot spot areas 720 and 740 can have the same power densities or power densities within a threshold amount of each other. In another example, the segmented ring-shaped hot spot area 720 can have a power density that is at least a threshold amount higher or lower than the power density of the segmented ring-shaped hot spot area 740.

The electronic components of each segmented ring-shaped hot spot area 720 and 740 can be arranged such that the thermal characteristics of the segmented ring-shaped hot spot area 720 and 740 are consistent or uniform throughout the segmented ring-shaped hot spot area 720 and 740. For example, the electronic components of the segmented ring-shaped hot spot area 720 can be arranged within the segmented ring-shaped hot spot area 720 such that the average power density of each individual segment 724A-724D of the segmented ring-shaped hot spot area 720 is within a threshold amount of each other segment 724A-724D. In another example, the electronic components of the segmented ring-shaped hot spot area 720 can be arranged within the segmented ring-shaped hot spot area 720 such that the average amount of heat produced by each individual segment 724A-724D of the segmented ring-shaped hot spot area 720 is within a threshold amount of each other segment 724A-724D. The electronic components of the segmented ring-shaped hot spot area 740 can be arranged similarly. The electronic components of the inner area 750 (if any), the intermediate area 730 (if any), and the outer area 710 (if any) can also be arranged to have consistent thermal characteristics throughout those areas.

In some implementations, the electronic components of the segments 724A-724D of the segmented ring-shaped hot spot area 720 can be arranged such that the segments 724A-724D have different thermal characteristics, as described above with respect to the segmented ring-shaped hot spot area 420 of FIG. 4. Similarly, the electronic components of the segments 744A-744D of the segmented ring-shaped hot spot area 740 can be arranged such that the segments 744A-744D have different thermal characteristics.

FIG. 8 is a block diagram of an example chip 800 with segmented ring-shaped hot spot areas 820 and 840. The segmented ring-shaped hot spot areas 820 and 840 are located on a surface 805 of the chip 800. The segmented ring-shaped hot spot area 820 can also occupy the same area of multiple other surfaces of other layers of the chip 800. Similarly, the segmented ring-shaped hot spot area 840 can also occupy the same area of multiple other surfaces of other layers of the chip 800.

The segmented ring-shaped hot spot area 820 is disposed between an outer area 810 of the surface 805 and an intermediate area 830 that is between the segmented ring-shaped hot spot area 820 and the segmented ring-shaped hot spot area 840. The segmented ring-shaped hot spot area 840 is disposed between an inner area 850 and the intermediate area 830. Thus, the segmented ring-shaped hot spot area 840 is nested within the segmented ring-shaped hot spot area 820 and the segmented ring-shaped hot spot area 820 substantially surrounds the segmented ring-shaped hot spot area 840 in this example.

Each segmented ring-shaped hot spot area 820 and 840 can be the same or similar to the ring segmented ring-shaped hot spot area 520 of FIG. 5. For example, the segmented ring-shaped hot spot area 820 includes four regions that each include multiple rectangular-shaped hot spot segments 824 spaced apart from one another. Similarly, the segmented ring-shaped hot spot area 840 includes four regions that each include multiple rectangular-shaped hot spot segments 844 spaced apart from one another.

The segmented ring-shaped hot spot area 820 includes four regions of segments 824 that are juxtaposed with perimeters defined by the outer area 810 and the intermediate area 830. The segmented ring-shaped hot spot area 840 also includes four regions of segments 844 that are juxtaposed with perimeters defined by the inner area 850 and the intermediate area 830. In this example, the segmented ring-shaped hot spot area 820, the segmented ring-shaped hot spot area 840, the inner area 850, the intermediate area 830, and the outer area 810 are all centrally disposed about the center of the surface 805 of the chip 800.

The chip 800 also includes another hot spot segment 841 located at the center of the surface 805. Each layer of the chip occupied by the segmented ring-shaped hot spot areas 820 and 840 can also include a segment 841 at the center of the surface for that layer. In other examples, each layer including the layer 805 does not include the segment 841.

The electronic components of the chip 800 can be arranged such that the power density of and/or the amount of heat produced by the segmented ring-shaped hot spot area 820 and the segmented ring-shaped hot spot area 840 is greater than that of the inner area 850, the intermediate area 830, and the outer area 810 of the chip 800 to provide better cooling for the electronic components of the segmented ring-shaped hot spot area 820, the segmented ring-shaped hot spot area 840, and the chip 800 as a whole. For example, the electronic components and/or groups of electronic components (e.g., individual circuits) of the chip 800 that have higher power densities can be arranged within the segmented ring-shaped hot spot areas 820 and 840. The areas 810, 830, and 850 can either include lower power density electronic components or no electronic components. For example, the intermediate area 830 can include conductive traces that electrically couple computation units (e.g., one or more processor cores) of the ring-shaped hot spot area 840 to computation units (e.g., one or more processor cores) of the segmented ring-shaped hot spot area 820. In a particular example, the segmented ring-shaped hot spot area 820 can include a processor core and the segmented ring-shaped hot spot area 840 can include a processor core.

The segments 824 and the segments 844 of the segmented ring-shaped hot spot areas 820 and 840 can have the same or different thermal characteristics. For example, the segments 824 and the segments 844 can have the same power densities or power densities within a threshold amount of each other. In another example, the segments 824 can have a power density that is at least a threshold amount higher or lower than the power density of the segments 844.

The electronic components of each segmented ring-shaped hot spot area 820 and 840 can be arranged such that the thermal characteristics of the segmented ring-shaped hot spot area 820 and 840 are consistent or uniform throughout the segmented ring-shaped hot spot area 820 and 840. For example, the electronic components of the segmented ring-shaped hot spot area 820 can be arranged within the segmented ring-shaped hot spot area 820 such that the average power density of each individual segment 824 is within a threshold amount of each other segment 824. In another example, the electronic components of the segmented ring-shaped hot spot area 820 can be arranged within the segmented ring-shaped hot spot area 820 such that the average amount of heat produced by each individual segment 824 is within a threshold amount of each other segment 824. The electronic components of the segmented ring-shaped hot spot area 840 can be arranged similarly. The electronic components of the inner area 850 (if any), the intermediate area 830 (if any), and the outer area 810 (if any) can also be arranged to have consistent thermal characteristics throughout those areas.

The arrangement of the ring-shaped hot spot areas can be selected based on tradeoffs between the amount of area of a chip needed to the higher power density electronic components or groups of electronic components and/or the desired cooling. For example, if more area is required, the ring-shaped hot spot arrangements on the chips 300 and 600 of FIG. 3 and FIG. 6 may be preferred as they provide more area within the ring-shaped hot spot area. However, if some hot spot area can be sacrificed, the segmented ring-shaped hot spot areas on the chips 400, 500, 700, and 800 can provide better cooling with less hot spot area.

Although FIGS. 6-8 show two ring-shaped hot spot areas on each chip, the chips can include more than two ring-shaped hot spot areas. For example, the chip 600 can include a third ring-shaped hot spot area disposed between the ring-shaped hot spot area 640 and the center of the surface 605 of the chip 600.

FIG. 9 is a block diagram of an example chip 900 with a cold plate 910 that provides multidirectional cooling. The chip 900 can be in the form of either chip 300-800 of FIGS.

3-8. That is, the chip 900 can include one or more ring-shaped hot spot areas, as illustrated in FIGS. 3-8 and described above.

The cold plate 910 can be attached to the top or bottom of the chip 900. The cold plate 910 is pin-fin cold plate with a set of pin fins 912 that extend from a base of the cold plate 910 away from the chip 900, as better illustrated in FIGS. 11 and 12. The pin fins 912 receive dissipated heat from the chip 900 similar to a heat sink.

The cold plate 910 includes a cooling fluid inlet 914 that receives cooling fluid (e.g. cooling water) from a cooling fluid source and passes the cooling fluid through the pin fins 912 and across a surface (e.g. the top or bottom surface) of the chip 900 to which the cooling plate 910 is attached. As shown in FIG. 9, the cooling fluid inlet 914 can be located at the center of the surface of the chip 900 and can pass the cooling fluid from the center towards each lateral side of the chip 900 as shown by the arrows in FIG. 9. As the cooling fluid passes the pin fins 912, heat is exchanged from the pin fins 912 to the cooling fluid, thereby removing heat from the ring-shaped hot spot area(s) of the chip 900. The cold plate 910 can include a cooling fluid outlet on each lateral side of the chip 910 to remove the cooling fluid from the cold plate.

This inside-out cooling fluid direction can be particularly advantageous for chips that have multiple ring-shaped hot spot areas and the ring-shaped hot spot area with the higher power density is located closer to the center of the surface of the chip than the lower power density ring-shaped hot spot area(s). In this way, the cooling fluid passes across the ring-shaped hot spot area that produces the most heat first when the cooling fluid is coldest, providing better cooling than if the cooling fluid passed over the ring-shaped hot spot area that produces the most heat last.

The cold plate 910 can also be configured for outside-in cooling. For example, the cold plate 910 can include a respective cooling fluid inlet at each lateral side of the chip 900 and a cooling fluid outlet at the center of the surface of the chip (where the cooling water inlet 914 is shown in FIG. 9). This can be particularly advantageous for chips that have multiple ring-shaped hot spot areas and the ring-shaped hot spot area with the highest power density is located closer to the outside perimeter of the chip than the lower power density ring-shaped hot spot area(s). In this way, the cooling fluid passes across the ring-shaped hot spot area that produces the most heat first when the cooling fluid is coldest, providing better cooling than if the cooling fluid passed over the ring-shaped hot spot area that produces the most heat last.

By using inside-out or outside in multidirectional coolant flow, the coolant can have the same or similar temperature when passing over the regions of the ring-shaped hot spot core. For example, if the coolant is passed from one side of the chip to the other such that the coolant passes multiple regions of the ring-shaped hot spot area, the temperature of the coolant may increase after passing over one region such that the coolant is hotter when passing over another region. Using the multi-directional coolant flow enables better cooling than passing the coolant from one side of the chip to the other as the coolant has a low temperature for each region of the ring-shaped hot spot area.

The cold plate 910 has a symmetric distribution point (e.g., cooling water inlet 914) at the center of the surface of the chip to provide uniform cooling to each region of the chip. The symmetric distribution point ensures that the coolant travels the same distance from the distribution point to each region of the chip and therefore has the same or similar temperature when passing over the regions.

FIG. 10 is a block diagram of another example chip 1000 with a cold plate 1010 that provides multidirectional cooling. The chip 1000 can be in the form of either chip 300-800 of FIGS. 3-8. That is, the chip 1000 can include one or more ring-shaped hot spot areas, as illustrated in FIGS. 3-8 and described above.

The cold plate 1010 can be attached to the top or bottom of the chip 1000. The cold plate 1010 is plate-fin cold plate with a set of plate fins 1012 that extend from a base of the cold plate 1010 away from the chip 1000, as better illustrated in FIGS. 11 and 12. The plate fins 1012 receive dissipated heat from the chip 1000 similar to a heat sink. The plate fins 1012 also form fluid distribution channels, such as the fluid distribution channel 1016 formed between the plate fins 1012A and 1012B.

The cold plate 1010 includes a cooling fluid inlet 1014 that receives cooling fluid (e.g. cooling water) from a cooling fluid source and passes the cooling fluid through the plate fins 1012 and across a surface (e.g. the top or bottom surface) of the chip 1000 to which the cooling plate 1010 is attached. As shown in FIG. 10, the cooling fluid inlet 1014 can be located at the center of the surface of the chip 1000 and can pass the cooling fluid from the center towards each lateral side of the chip 1000 as shown by the arrows in FIG. 10. As the cooling fluid passes the plate fins 1012, e.g., in the cooling fluid distribution channels, heat is exchanged from the plate fins 1012 to the cooling fluid, thereby removing heat from the ring-shaped hot spot area(s) of the chip 1000. The cold plate 1010 can include a cooling fluid outlet on each lateral side of the chip 1010 to remove the cooling fluid from the cold plate.

The cold plate 1010 can also be configured for outside-in cooling. For example, the cold plate 1010 can include a respective cooling fluid inlet at each lateral side of the chip 1000 and a cooling fluid outlet at the center of the surface of the chip (where the cooling water inlet 1014 is shown in FIG. 10).

The pin-fin diameter and spacing in FIG. 9 and channel gaps and fin thickness in FIG. 10 can be configured to ensure that coolant flow commensurate with the rate load (e.g., proportional to the rate load) can be realized for chip geometries that are rectangular. That is, some sides of the ring-shaped hot spot area may dissipate more heat than others. The multi-directionality realized by the cold plate 1010 of FIG. 10 provides coolant flow in four directions and lends itself for use with square or other rectangular-shaped hot spot areas with alignment between the sides of the cold plate 1010 and the sides of the hot spot area. The pin-fin design of FIG. 9 can accommodate other shapes, such as circular or non-rectangular hot-spot areas.

The chip package 1100 is mounted on a circuit board 1120. The chip package 1100 includes a substrate 1122, a silicon interposer 1124, and the chip mounted on the silicon interposer 1124. In this example, the chip package 1100 includes a lid 1126 over the chip 1102. The cold plate 1110 is attached to the lid 1126.

The chip package 1110 is mounted on a circuit board 1120. The chip package 1100 includes a substrate 1122, a silicon interposer 1124, and the chip mounted on the silicon interposer 1124. In this example, the chip package 1100 includes a lid 1126 over the chip 1102. The cold plate 1110 is attached to the lid 1126.

The cold plate 1110 includes a base 1116 attached to the lid 1126 and a set of pin fins 1112 extending from the base. In other example, the cold plate 1110 can include plate fins instead of pin fins. The base of the cold plate 1116 receives heat that is dissipated from the ring-shaped hot spot area(s)

of the chip 1102 and the heat is distributed to the pin fins 1112. The pin fins 1112 located above the ring-shaped hot spot area(s) may receive more heat then pin fins over other areas of the chip 1102 due to the higher amounts of heat produced by the ring-shaped hot spot area(s).

The cold plate 1110 also includes a cooling fluid inlet 1114 that receives cooling fluid from a cooling fluid source. The cold plate 1110 also includes a cooling fluid outlet 1115 through which the cooling fluid exits the cold plate 1110. Although a single cooling fluid outlet is illustrated in FIG. 11, the cold plate 1110 can include multiple cooling fluid outlets, e.g., one or more on each lateral side of the cold plate 1110.

The cooling fluid enters the cold plate 1110 through the cooling fluid inlet and passes by the pin fins 1112 on the way to the cooling fluid outlet(s) 1115. As the cooling fluid passes the pin fins 1112, the cooling fluid removes some of the heat from the pin fins and takes the heat out of the cold plate 1110 through a cold plate outlet 1115.

Figure 12:
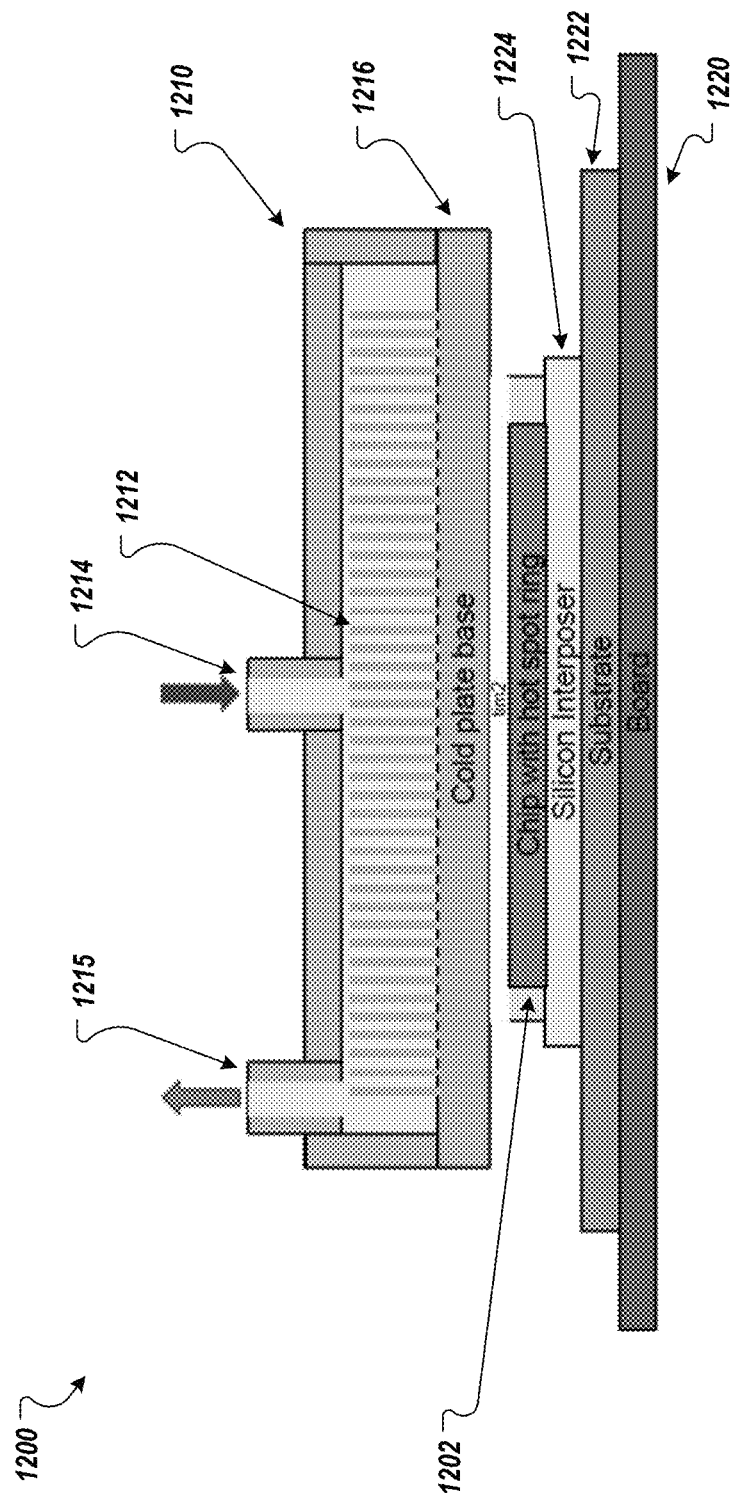
FIG. 12 illustrates an example lidless chip package that includes a chip and a cold plate.

FIG. 12 illustrates an example lidless chip package 1200 that includes a chip 1202 and a cold plate 1210. The chip 1202 can include one or more ring-shaped hot spot areas. For example, the chip 1202 can be in the form of either chip 300-800 of FIGS. 3-8.

The chip package 1200 is mounted on a circuit board 1220. The chip package 1200 includes a substrate 1222, a silicon interposer 1224, and the chip mounted on the silicon interposer 1224. In this example, the chip package 1200 is lidless and does not include a lid.

The cold plate 1210 includes a base 1216 and a set of pin fins 1212 extending from the base. In other example, the cold plate 1210 can include plate fins instead of pin fins. The base of the cold plate 1216 receives heat that is dissipated from the ring-shaped hot spot area(s) of the chip 1202 and the heat is distributed to the pin fins 1212. The pin fins 1212 located above the ring-shaped hot spot area(s) may receive more heat then pin fins over other areas of the chip 1202 due to the higher amounts of heat produced by the ring-shaped hot spot area(s).

The cold plate 1210 also includes a cooling fluid inlet 1214 that receives cooling fluid from a cooling fluid source. The cold plate 1210 also includes a cooling fluid outlet 1215 through which the cooling fluid exits the cold plate 1210. Although a single cooling fluid outlet is illustrated in FIG. 12, the cold plate 1210 can include multiple cooling fluid outlets, e.g., one or more on each lateral side of the cold plate 1210.

The cooling fluid enters the cold plate 1210 through the cooling fluid inlet and passes by the pin fins 1212 on the way to the cooling fluid outlet(s) 1215. As the cooling fluid passes the pin fins 1212, the cooling fluid removes some of the heat from the pin fins and takes the heat out of the cold plate 1210 through a cold plate outlet 1215.

Figure 13:
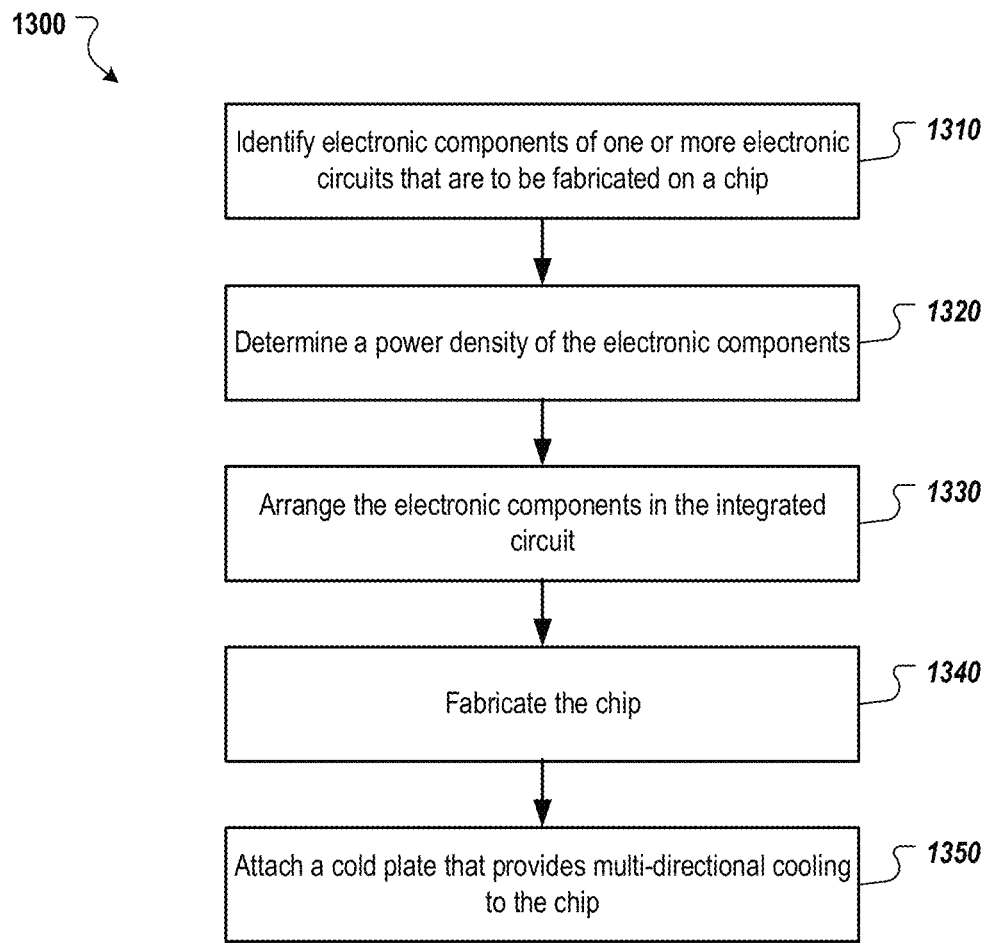
FIG. 13 is a flow diagram that illustrates an example process for fabricating an integrated circuit.

FIG. 13 is a flow diagram that illustrates an example process 1300 for fabricating an integrated circuit. The process 1300 can be performed by a system that includes one or more data processing apparatus and a chip fabrication system.

The system identifies electronic components of one or more electronic circuits that are to be fabricated on a chip (1310). For example, the system can receive a schematic diagram of the circuit(s).

The system determines a power density of the electronic components (1320). For example, the system can access, for each electronic component or each group of electronic components (e.g., each individual circuit), data that specifies the power density of the electronic component or group of electronic components. In another example, the system can access, for each electronic component or group of electronic components, data specifying an amount of heat produced by the electronic component or group of electronic components.

The system arranges the electronic components and/or groups of electronic components in the integrated circuit (1330). The system can arrange the electronic components and/or groups based on the power density and/or amount of heat for each component or group. As described above, components or groups with higher power densities and/or higher amounts of heat can be arranged in ring-shaped hot spot areas and components with lower power densities or lower amounts of heat can be arranged in other parts of the chip outside of the ring-shaped hot spot areas.

The system fabricates the chip (1340). The system can fabricate the chip such that the electronic components and/or groups of electronic components are located in their respective locations based on the determined arrangement of the components.

The system attaches a cold plate to the chip (1350). The cold plate can provide multidirectional cooling for the chip. For example, the cold plate can include a cooling fluid inlet and multiple cooling fluid outlets. The cooling fluid outlets can be located on different sides of the cold plate that correspond to different sides of the chip so that the cooling fluid passes across the ring-shaped hot spot areas on each side of the center of the chip. For example, the cold plate can pass a cooling fluid (e.g., cold water) across the ring-shaped hot spot areas of the chip using inside-out or outside-in cooling fluid flow, as described above.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. An integrated circuit, comprising:
a first area along an outside perimeter of a first surface of the integrated circuit, the first area defining a first inner perimeter and comprising a first set of electronic components arranged between the outside perimeter and the first inner perimeter;
a second area comprising a center of the integrated circuit on the first surface and that includes a second set of electronic components, the second area defining a first outer perimeter that is less than the first inner perimeter and spaced apart from the first inner perimeter; and
a ring-shaped hot spot area disposed between the first area and the second area on the first surface, wherein the ring-shaped hot spot area:
defines a ring outer perimeter that is juxtaposed with the first inner perimeter of the first area;
defines a ring inner perimeter that is juxtaposed with the first outer perimeter of the second area to substantially surround the second area; and
includes a third set of electronic components that (i) produce more heat than the first set of electronic components during operation of the integrated circuit and (ii) produce more heat than the second set of electronic components during operation of the integrated circuit, wherein the first area surrounds the ring-shaped hot spot area and the second area.

2. The integrated circuit of claim 1, wherein the first area, the second area, and the ring-shaped hot spot area are centrally disposed about the center of the integrated circuit on the first surface.

3. The integrated circuit of claim 1, wherein the third set of electronic components include computational components of a microprocessor core of the integrated circuit.

4. The integrated circuit of claim 1, wherein the ring-shaped hot spot area comprises four rectangular-shaped segments of electronic components that form a continuous rectangular-shaped ring about the second area on the first surface of the integrated circuit.

5. The integrated circuit of claim 1, wherein the ring-shaped hot spot area comprises four rectangular-shaped segments of electronic components that form a segmented rectangular ring-shaped hot spot area.

6. The integrated circuit of claim 1, wherein:
the ring-shaped hot spot area comprises a set of rectangular-shaped segments that are distributed about the ring-shaped hot spot area and that are spaced apart from each other rectangular-shaped segment; and
spaces between the rectangular-shaped segments comprise electronic components that produce less heat than electronic components in the rectangular-shaped segments.

7. The integrated circuit of claim 1, further comprising a second ring-shaped hot spot area disposed between the ring-shaped hot spot area and the second area, the second ring-shaped hot spot area substantially surrounding the second area and including a fourth set of electronic components that produce more heat than the second set of electronic components.

8. The integrated circuit of claim 7, wherein the fourth set of electronic components produce a different amount of heat than the third set of electronic components.

9. The integrated circuit of claim 7, wherein the second ring-shaped hot spot area comprises four rectangular-shaped segments of electronic components that form a continuous hollow box-shaped area around the second area.

10. The integrated circuit of claim 7, wherein the second ring-shaped hot spot area comprises four rectangular-shaped segments of electronic components that form a segmented rectangular ring-shaped hot spot area.

11. The integrated circuit of claim 7, wherein:
the second ring-shaped hot spot area comprises a set of rectangular-shaped segments that are distributed about the second ring-shaped hot spot area and that are spaced apart from each other rectangular-shaped segment; and
spaces between the rectangular-shaped segments comprise electronic components that produce less heat than electronic components in the rectangular-shaped segments.

12. The integrated circuit of claim 1, further comprising a fin array cold plate comprising a base disposed over the ring-shaped hot spot area and that passes a cooling liquid in multiple directions over the base disposed over the ring-shaped hot spot area such that the cooling liquid passes over the ring-shaped hot spot area.

13. The integrated circuit of claim 12, wherein the fin array cold plate comprises a pin-fin array cold plate or a plate-fin array cold plate.

14. The integrated circuit of claim 12, wherein the fin array cold plate passes the cooling liquid in four lateral directions over the ring-shaped hot spot area.

15. The integrated circuit of claim 12, wherein the fin array cold plate is configured to provide one or more of (i) outside-in cooling liquid flow in a direction from one or more sides of the outside perimeter of the integrated circuit towards the center of the integrated circuit or (ii) inside-out cooling liquid flow in a direction from the center of the integrated circuit towards the one or more sides of the outside perimeter of the integrated circuit.

16. The integrated circuit of claim 15, wherein the fin array cold plate comprises a symmetric distribution point that provides uniform cooling.

17. The integrated circuit of claim 12, further comprising a second ring-shaped hot spot area disposed between the ring-shaped hot spot area and the second area, the second ring-shaped hot spot area substantially surrounding the second area and including a fourth set of electronic components that produce more heat than the first set of electronic components and the third set of electronic components, wherein:
the fin array cold plate passes the cooling liquid over both the ring-shaped hot spot area and the second ring-shaped hot spot area.

18. The integrated circuit of claim 1, wherein the third set of electronic components comprises computational circuits and the second set of electronic components comprises memory circuits.

19. An integrated circuit, comprising:
- a first area along an outside perimeter of a first surface of the integrated circuit, the first area defining a first inner perimeter and comprising a first set of electronic components arranged between the outside perimeter and the first inner perimeter;
- a second area comprising a center of the integrated circuit on the first surface and that includes a second set of electronic components, the second area defining a first outer perimeter that is less than the first inner perimeter and spaced apart from the first inner perimeter; and
- a ring-shaped hot spot area disposed between the first area and the second area on the first surface, wherein the ring-shaped hot spot area:
  - defines a ring outer perimeter that is juxtaposed with the first inner perimeter of the first area;
  - defines a ring inner perimeter that is juxtaposed with the first outer perimeter of the second area to substantially surround the second area; and
  - includes a third set of electronic components that (i) have a higher power density than the first set of electronic components and (ii) have a higher power density than the second set of electronic components, wherein the first area surrounds the ring-shaped hot spot area and the second area.

20. The integrated circuit of claim 19, wherein the ring-shaped hot spot area comprises four rectangular-shaped segments of electronic components that form a continuous rectangular-shaped ring about the second area on the first surface of the integrated circuit.

* * * * *